United States Patent
Taravade et al.

(10) Patent No.: US 6,841,308 B1
(45) Date of Patent: Jan. 11, 2005

(54) ADJUSTABLE TRANSMISSION PHASE SHIFT MASK

(75) Inventors: Kunal N. Taravade, Portland, OR (US); Dodd C. Defibaugh, Camas, WA (US)

(73) Assignee: LSI Logic Corporation, Milpitas, CA (US)

(*) Notice: Subject to any disclaimer, the term of this patent is extended or adjusted under 35 U.S.C. 154(b) by 84 days.

(21) Appl. No.: 10/039,508

(22) Filed: Nov. 9, 2001

(51) Int. Cl.[7] .............................. G03F 9/00; G03F 7/00
(52) U.S. Cl. ........................ 430/5; 430/290; 430/322
(58) Field of Search .......................... 430/5, 290, 322

(56) References Cited

U.S. PATENT DOCUMENTS

| | | | |
|---|---|---|---|
| 5,472,811 A | 12/1995 | Vasudev et al. ............... 430/5 |
| 5,561,541 A | 10/1996 | Sharp et al. .................. 359/66 |
| 5,592,325 A * | 1/1997 | Dodge et al. ............... 359/326 |
| 5,670,280 A | 9/1997 | Lawandy ....................... 430/5 |
| 5,939,227 A * | 8/1999 | Smith ......................... 430/322 |
| 5,962,174 A | 10/1999 | Pierrat ........................... 430/5 |
| 5,985,492 A | 11/1999 | Wheeler et al. ............... 430/5 |
| 6,027,837 A | 2/2000 | Adair et al. .................... 430/5 |
| 6,277,526 B1 | 8/2001 | Yang ............................. 430/5 |
| 6,436,588 B1 * | 8/2002 | Mason et al. .................. 430/5 |
| 6,692,894 B1 * | 2/2004 | Nakano et al. .......... 430/273.1 |

OTHER PUBLICATIONS

Jahncke et al., "Raman Imaging with Near-field Scanning Optical Microscopy," Appl. Phys. Lett. 67, (17), 2483–2485 (1995).

* cited by examiner

Primary Examiner—Mark F. Huff
Assistant Examiner—Nicole Barreca
(74) Attorney, Agent, or Firm—Luedeka, Neely & Graham

(57) ABSTRACT

A phase shift mask having transmission properties that are dependent at least in part on an intensity of an incident light beam. The phase shift mask has a mask substrate that is substantially transparent to the incident light beam. A first phase shift layer is disposed on the mask substrate. The first phase shift layer has a refractive index that is nonlinear with the intensity of the incident light beam. The refractive index of the first phase shift layer changes with the intensity of the incident light beam on the phase shift mask. By using a first phase shift layer on the phase shift mask that has a refractive index that is non linear with the intensity of the incident light beam, properties of a light beam transmitted through the first phase shift layer, such as interference patterns in the transmitted light beam, can be adjusted by adjusting the intensity of the incident light beam. Thus, in this manner there is provided an additional tool by which the exposure patterns produced by the phase shift mask can be adjusted. In other words, the transmission properties of the phase shift mask are adjustable with the intensity of the incident light beam.

6 Claims, 3 Drawing Sheets

ADJUSTABLE TRANSMISSION PHASE SHIFT MASK

FIELD

This invention relates to the field of integrated circuit fabrication and, in particular, to improved photolithography masks for use in fabricating integrated circuit devices and methods for making the masks.

BACKGROUND

As integrated circuits continue to shrink in size, the processes by which they are formed are increasingly limited by fundamental physical laws. For example, in forming structures that are less than about a quarter micron in length, or in other words less than about 250 nanometers long, such as gate structures in a metal oxide semiconductor device, the ability of the radiation used to pattern the structure during the photolithography process is seriously challenged. Photolithography processes typically use ultraviolet radiation with a wavelength of about 248 nanometers to expose the photoresist used to pattern the structures. Unfortunately, a beam of light beam with a wavelength of 248 nanometers has difficulty in resolving the closely spaced features in a masking pattern that is not appreciably greater than the wavelength of the light beam. Thus, the processes used to form integrated circuits must necessarily change as even smaller device features, such as 100 nanometer gate lengths, are desired.

One method of forming devices with smaller features is to use electromagnetic radiation with smaller wavelengths during the photolithography process. For example, electromagnetic radiation with a wavelength of 193 nanometers provides the ability to pattern features that are about twenty percent smaller than those patterned; with electromagnetic radiation having a wavelength of 248 nanometers. However, moving to steppers and other exposure tools that utilize 193 nanometer technology is still insufficient, of itself, to produce 100 nanometer features. Radiation with even shorter wavelengths, such as 157 nanometers, presents serious cost considerations and other technical challenges. Thus, other improvements to the photolithography process are required.

Some of these other improvements provide for the ability to accomplish so-called sub wavelength patterning of photoresist. By this it is meant that the techniques employed provide the ability for the electromagnetic radiation to pattern features that have dimensions that are smaller than the wavelength of the electromagnetic radiation so employed. One such technique is the use of phase shift masks.

Phase shift lithography provides control of the phase of an exposure of light beam at a target. Adjacent bright areas are formed which are preferably 180 degrees out of phase with one another. Dark regions are produced between the bright areas by destructive interference between the radiation phases. One problem with phase shift masks is that they are typically selected to be compatible with the particular photoresist material being patterned. In order to be effective, the photoresist material being patterned must be closely matched to the phase shift mask being used. However, it is desirable to use a wider variety of photoresist materials to provide closer spacing and finer definition of patterned integrated circuit devices.

What is needed, therefore, is a phase shift mask with variable transmission properties that allows for the use of different photoresists.

SUMMARY

The above and other needs are met by a phase shift mask having transmission properties that are dependent at least in part on an intensity of an incident light beam. The phase shift mask has a mask substrate that is substantially transparent to the incident light beam. A first phase shift layer is disposed on the mask substrate. The first phase shift layer has a refractive index that is nonlinear with the intensity of the incident light beam. The refractive index of the first phase shift layer changes with the intensity of the incident light beam on the phase shift mask.

By using a first phase shift layer on the phase shift mask that has a refractive index that is non linear with the intensity of the incident light beam, properties of a light beam transmitted through the first phase shift layer, such as interference patterns in the transmitted light beam, can be adjusted by adjusting the intensity of the incident light beam. Thus, in this manner there is provided an additional tool by which the exposure patterns produced by the phase shift mask can be adjusted. In other words, the transmission properties of the phase shift mask are adjustable with the intensity of the incident light beam.

In another aspect the invention provides a method for making a phase shift mask. A first phase shift layer is applied to a substantially transparent mask substrate. The first phase shift layer is selected from alkali metal titanyl phosphates. Photoresist is applied to the first phase shift layer on the mask substrate, and the photoresist is developed to provide a mask pattern. The first phase shift layer is etched according to the mask pattern. The photoresist is stripped from the mask substrate to provide the phase shift mask, which exhibits a transmission that is dependent at least in part on an intensity of an incident light beam on the first phase shift layer.

In yet another aspect the invention provides a method for making an integrated circuit. Photoresist is applied to a layer on a substrate. An incident light beam is passed through a phase shift mask to produce a transmitted light beam. The phase shift mask includes a mask substrate that is substantially transparent to the incident light beam, and a first phase shift layer that is disposed on the mask substrate. The first phase shift layer has a refractive index that is nonlinear with an intensity of the incident light beam. The refractive index of the first phase shift layer changes with the intensity of the incident light beam on the phase shift mask.

The properties of the transmitted light beam as propagated through the first phase shift layer are adjusted by adjusting the intensity of the incident light beam. The desired pattern is exposed in the photoresist with the transmitted light beam, where the adjusted properties of the transmitted light beam assist in producing the desired pattern. The photoresist is developed to provide an etching mask, and the layer on the substrate is etched to form a structure of the integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
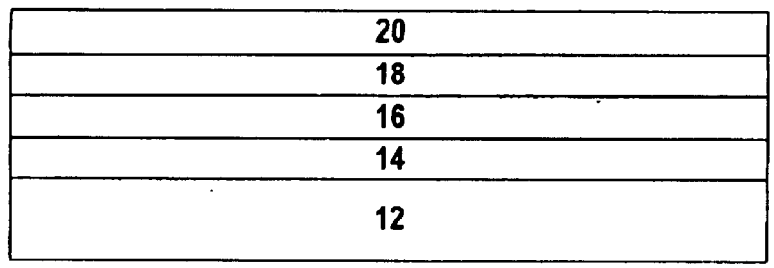
FIG. 1 is a cross sectional view of a mask substrate containing multiple layers and photoresist for patterning the phase shift layers.

With reference now to FIGS. 1–8, the invention provides a mask 10 for use in patterning structures, such as for integrated circuits. The mask 10 is patterned as described below to provide areas of adjustable light beam transmission through the mask 10. Accordingly, a mask substrate 12 is selected from materials that are substantially transparent or semitransparent to the wavelengths of an incident light beam that is to be used with the mask 10. Such materials preferably include quartz, glass, calcium fluoride, diamond, diamond-like carbon, fused silica and the like. A particularly preferred mask substrate 12 material is quartz. The mask substrate 12 preferably causes a phase shift in the incident light beam of from about one hundred and seventy degrees to about one hundred and eighty degrees. In other words, a transmitted light beam that exits the mask substrate 12 has been phase shifted from the orientation of the incident light beam by the mask substrate 12.

A layer 14 of a first phase shift material is applied to the mask substrate 12. The first phase shift layer 14 is preferably formed of a material having a refractive index that is linear with the intensity of the incident light beam, and which produces a phase shift in the incident light beam of at least about one hundred and sixty degrees. Such materials include, but are not limited to, magnesium fluoride, titanium dioxide, zinc oxide, aluminum oxide, polyvinylfluoride, silicon oxide, magnesium oxide, molybdenun silicide, molybdenum silicon nitride, carbon, chrome oxide, chrome nitride, silicon nitride, chrome fluoride, chrome oxide fluoride and the like. A particularly preferred material for the first phase shift layer 14 is molybdenum silicide.

A second phase shift layer 16 is preferably applied to the first phase shift layer 14. The second phase shift layer 16 preferably has an index of refraction that is nonlinear with the intensity of the incident light beam, and thus preferably produces a phase shift in the incident light beam that is dependent at least in part on the intensity of the incident light beam. The second phase shift layer 16 is preferably formed from alkali metal phosphates such as potassium titanyl phosphate, calcium titanyl phosphate and rubidium titanyl phosphate. The second phase shift layer 16 may also be provided by organic liquid crystal compounds which are solid at room temperature. Representative examples of suitable organic liquid crystal compounds include, but are not limited to alkyl and alkoxy substituted aryl compounds selected from the following:

N-(p-methoxybenzylidene)-p-butylaniline,
n-pentylphenyl-4-n-methoxybenzoate,
N-(p-methylbenzylidene)-p-butylaniline,
4-n-pentylphenyl-4-n-methoxybenzoate,
4-n-butylphenyl-4-n-pentylbenzoate,
4-n-butylphenyl-4-n-butylbenzoate, and
4-n-pentylphenyl-4-n-butylbenzoate, and the like, which may also include organic dyes to enhance the non linearity of the compounds.

Liquid crystal compounds, such as those listed above, may be deposited or formed on the top of the mask substrate 12 or first phase shift layer 14 using processes su ch as chemical vapor deposition. In general, organic nonlinear optical materials are prepared by mixing various chemical constituents, and allowing them to coalesce on the mask substrate 12 under specific pressure and temperatures, and under the application of a sufficiently strong electric field.

A substantially opaque layer 18 is applied to the second phase shift layer 16. The opaque layer 18 is preferably formed from metals and metal oxides and nitrides including but not limited to chrome, titanium dioxide, zinc oxide, aluminum oxide, silicon oxide, magnesium oxide, chrome oxide, chrome nitride, silicon nitride and the like. A particularly preferred material for layer 18 is chrome or chrome oxide.

Each of the layers 14, 16 and 18 may be applied to or deposited on the mask substrate 12 by a variety of microelectronic processing techniques, including but not limited to chemical vapor deposition, sputtering, spin coating, and the like. The thickness of each layer 14, 16 and 18 typically ranges from about five hundred angstroms to about one thousand angstroms or more.

Figure 2:
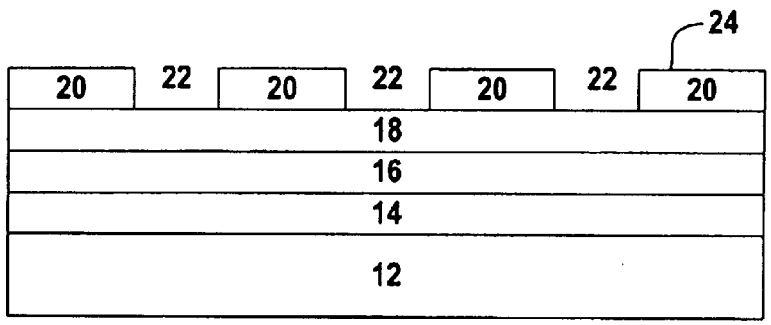
FIG. 2 is a cross sectional view of the mask substrate containing layers and patterned photoresist for etching patterns in the layers.
Figure 3:
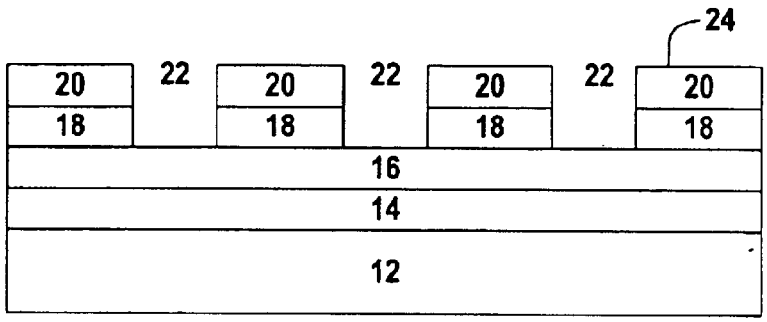
FIG. 3 is a cross sectional view of the mask substrate containing layers wherein a first layer is etched according to the pattern provided in the photoresist.

Photoresist 20 is also applied to the mask 10. A desired pattern is formed in the photoresist, as depicted in FIG. 2, which shows trenches 22 and islands 24. It is appreciated the pattern as depicted in FIG. 2 is representational only, and that in actual practice of the invention, a wide variety of shapes may be patterned in the photoresist 20.

The photoresist 20 provides a pattern for forming etched features in the layers 14, 16, and 18, as illustrated with reference to FIGS. 3–7. It is preferred to us etchants that are relatively highly selective for the phase shift layer being etched. In this manner, different layers may be etched in different patterns. The mask substrate 12 may also be selectively etched in different portions of the pattern.

Although only a single etched patterned is depicted in the figures and described in the example that follows, it is appreciated that by removing and reapplying photoresist layers with differing patterns, a wide variety of different patterns of the various layers 14, 16, and 18 can be formed, where different ones and combinations of the various layers are present in different portions of the mask 10. This is additionally facilitated by patterning the various layers 14, 16, and 18 prior to depositing a subsequent layer 14 or 18.

It is also appreciated that the number of such layers 14, 16, and 18 is also representational, and that different numbers of these and other layers may be used, and in different combinations of layers, to provide very complicated and specifically designed stack structures. Further, the layers 14, 16, and 18 can be applied in an order that is different from that as described herein. Thus, the specific embodiments described herein are extremely basic in nature, and are only given for the purpose of clarity in the description, and not by way of limitation.

Figure 4:
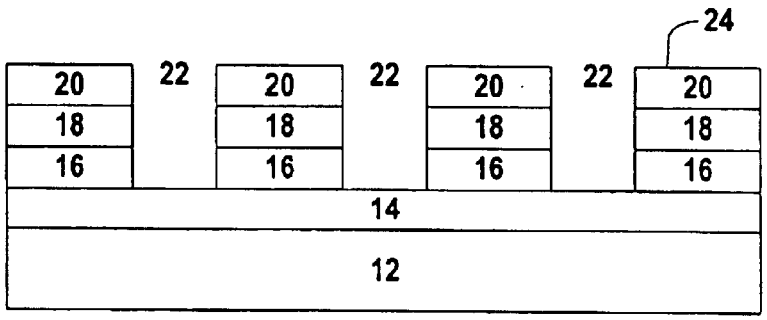
FIG. 4 is a cross sectional view of the mask substrate containing layers wherein a second layer is etched according to the pattern provided in the photoresist.
Figure 5:
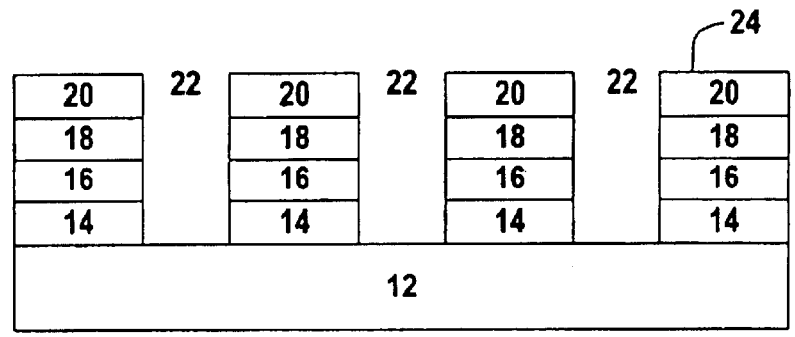
FIG. 5 is a cross sectional view of the mask substrate containing layers wherein a third layer is etched according to the pattern provided in the photoresist.
Figure 6:
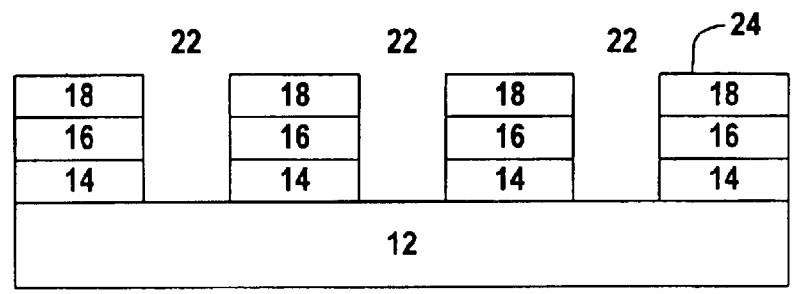
FIG. 6 is a cross sectional view of the mask substrate containing patterned layers according to a first embodiment of the invention.

To continue with the basic example, in the first etching step the layer 18 is etched (FIG. 3) to provide features corresponding to trenches 22 and islands 24 (FIG. 2). Next, the second phase shift layer 16 is etched as shown in FIG. 4. Finally, the first phase shift layer 14 is etched to provide the etched features illustrated in FIG. 5. After etching the layers 14, 16 and 18, the photoresist 20 is preferably removed and the phase shift mask 10 is cleaned, as depicted in FIG. 6.

Figure 7:
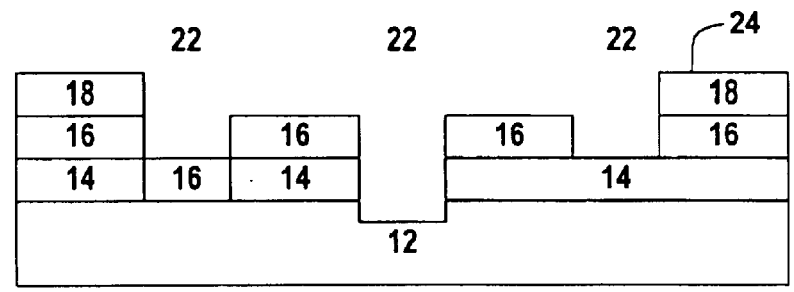
FIG. 7 is a cross sectional view of the mask substrate containing patterned layers according to a second embodiment of the invention.
Figure 8:
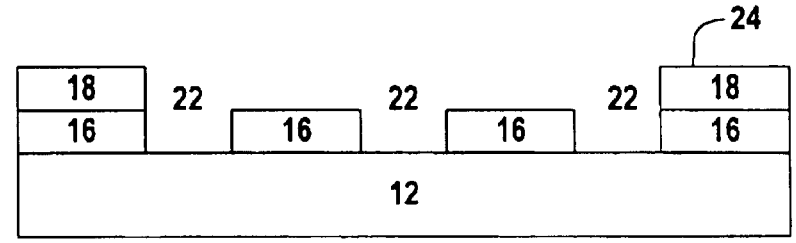
FIG. 8 is a cross sectional view of the mask substrate containing patterned layers according to a third embodiment of the invention.

FIG. 7 depicts an alternate embodiment of the phase shift mask 10, where different photoresist layers 20 have been employed at different times to produce a more complex phase shift mask 10. FIG. 8 depicts an embodiment of the phase shift mask 10 without the first linear phase shift layer 14, where the second nonlinear phase shift layer 16 is used in conjunction with the opaque layer 18.

Figure 9:
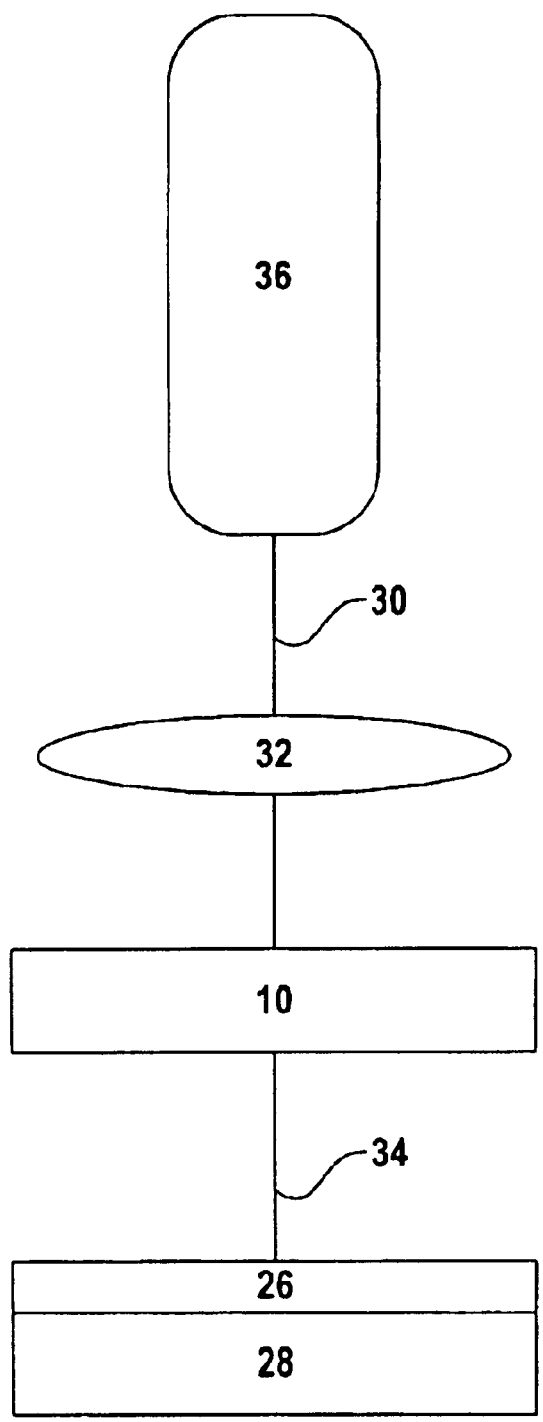
FIG. 9 is a schematic representation of a process using a phase shift mask made according to the invention to form structures in an integrated circuit.

The phase shift mask 10 is used to pattern a wide variety of photoresists 26, such as are applied to an integrated circuit substrate 28, as depicted in FIG. 9. An advantage of the invention is that a wider variety of resist materials may be used for layer 26, since the phase shift layers 14 and 16 of the phase shift mask 10 may be selected from materials having refractive indices that are both linear and nonlinear with the intensity of the incident light beam 30.

For example, during a patterning process using the phase shift mask 10, a source such as an excimer laser 36, using a krypton fluoride, argon fluoride, or fluorine gas source for example, provides an incident light beam 30 that is directed through a lens 32 and the phase shift mask 10 to produce a transmitted light beam 34 that is focused on the photoresist layer 26 of the integrated circuit substrate 28. After exposing the photoresist 26, conventional photolithography processes are preferably used to create the desired structures in the substrate 28.

The foregoing description of preferred embodiments for this invention have been presented for purposes of illustration and description. They are not intended to be exhaustive or to limit the invention to the precise form disclosed. Obvious modifications or variations are possible in light beam of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A phase shift mask having transmission properties that are dependent at least in part on an intensity of an incident light beam, the phase shift mask comprising:

a mask substrate that is substantially transparent to the incident light beam, and a patterned first phase shift layer disposed on the mask substrate, the first phase shift layer having a refractive index that is nonlinear with the intensity of the incident light beam, wherein the refractive index of the first phase shift layer changes with the intensity of the incident light beam on the phase shift mask.

2. The phase shift mask of claim 1 wherein properties of a light beam transmitted through the phase shift mask are proportional to the intensity of the incident light beam on the phase shift mask.

3. The phase shift mask of claim 1 wherein the first phase shift layer is formed of at least one of potassium titanyl phosphate and rubidium titanyl phosphate.

4. The phase shift mask of claim 1 further comprising a second phase shift layer formed of at least one of molybdenum silicide, carbon, chrome oxide, chrome nitride, silicon nitride, chrome fluoride, and chrome oxide fluoride.

5. The phase shift mask of claim 1 wherein the first phase shift layer is formed of at least one of potassium titanyl phosphate and rubidium titanyl phosphate, and further comprising a second phase shift layer that is formed of molybdenum silicide.

6. The phase shift mask of claim 1 wherein the mask substrate is formed of at least one of quartz, glass, calcium fluoride, diamond, diamond-like carbon, and fused silica.

* * * * *